US006839135B2

(12) United States Patent
Hamm et al.

(10) Patent No.: US 6,839,135 B2
(45) Date of Patent: Jan. 4, 2005

(54) OPTICAL DEVICE

(75) Inventors: Thomas Hamm, Remchingen (DE); Beno Mueller, Ettlingen (DE)

(73) Assignee: Agilent Technologies, Inc., Palo Alto, CA (US)

(*) Notice: Subject to any disclaimer, the term of this patent is extended or adjusted under 35 U.S.C. 154(b) by 196 days.

(21) Appl. No.: 09/832,687

(22) Filed: Apr. 11, 2001

(65) Prior Publication Data

US 2001/0030746 A1 Oct. 18, 2001

(30) Foreign Application Priority Data

Apr. 11, 2000 (DE) .................................. 200 06 642 U

(51) Int. Cl.[7] .............................................. G01J 3/28
(52) U.S. Cl. .................. 356/328; 356/305; 356/326; 250/208.1
(58) Field of Search .............................. 356/328, 305, 356/326; 250/208.1

(56) References Cited

U.S. PATENT DOCUMENTS

| 3,532,429 A | * | 10/1970 | Hughes et al. | ............... 350/162 |
| 4,259,014 A | * | 3/1981 | Talmi | ............... 356/328 |
| 4,467,361 A | | 8/1984 | Ohno et al. | ............... 358/213 |

(List continued on next page.)

FOREIGN PATENT DOCUMENTS

| DE | 3544512 C2 | 6/1987 | ............ G01J/3/28 |
| DE | 19523140 A1 | 1/1997 | ............ G01J/3/36 |
| DE | 29823791 U1 | 12/1999 | ......... H01L/27/144 |
| EP | 0 451 968 | 10/1991 | |
| EP | 0 803 911 | 10/1997 | |
| JP | 04-369271 | 12/1992 | |
| JP | 05-102483 | 4/1993 | |
| JP | 06-037314 | 2/1994 | |
| JP | 07-202210 | 8/1995 | |
| JP | 08-051207 | 2/1996 | |
| JP | 08-078329 | 3/1996 | |
| JP | 08-110530 | 4/1996 | |
| JP | 10-135468 | 5/1998 | |
| JP | 10-135469 | 5/1998 | |
| JP | 10-144929 | 5/1998 | |
| JP | 10-247735 | 9/1998 | |

OTHER PUBLICATIONS

German Patent Office Search Results, Nov. 2000.
U.S. patent application Ser. No. 10/386,257 including specification, drawings, claims, and filing receipt; filed Mar. 11, 2003; Inventor: Hideto Ohnuma.
U.S. patent application Ser. No. 09/454,146 including specification, drawings, claims, and filing receipt; filed Dec. 3, 1999; Inventors: Shunpei Yamazaki, et al.
Yoshida et al., "A Full–Color Thresholdless Antiferroelectric LCD Exhibiting Wide Viewing Angle with Fast Response Time," SID 97 Digest, pp. 841–844.
Hwang et al., "High Performance Submicron SOI/CMOS with an Elevated Source/Drain Structure," Proceedings of the Annual SOS/SOI Technology Conference, IEEE, vol. 19, 1993, pp. 132–133.
Choi et al., "Gate–Overlapped Lightly Doped Drain Poly–Si Thin–Film Transistors for Large Area–AMLCD," IEEE Transactions on Electron Devices, vol. 45, No. 6, Jun., 1998, pp. 1272–1279.

(List continued on next page.)

Primary Examiner—Michael G. Lee
Assistant Examiner—Seung H Lee

(57) ABSTRACT

An optical device includes an imaging device for imaging an incident beam onto a focal surface, and a support element which includes at least one side having a shape corresponding to the focal surface, where the side is located on the focal surface. The invention also includes a sensor array in close contact with the side of the support element having the shape of the focal surface.

21 Claims, 3 Drawing Sheets

U.S. PATENT DOCUMENTS

| | | | | |
|---|---|---|---|---|
| 4,647,202 A | * | 3/1987 | Kimura et al. | 250/458.1 |
| 4,963,504 A | | 10/1990 | Huang | |
| 5,018,856 A | * | 5/1991 | Harnly et al. | 356/305 |
| H1152 H | * | 3/1993 | Korendyke | 356/328 |
| 5,323,042 A | | 6/1994 | Matsumoto | |
| 5,343,289 A | * | 8/1994 | Crawford et al. | 356/328 |
| 5,399,502 A | | 3/1995 | Friend et al. | |
| 5,412,240 A | | 5/1995 | Inoue et al. | |
| 5,424,827 A | * | 6/1995 | Horwitz et al. | 356/328 |
| 5,436,723 A | * | 7/1995 | Kunselman et al. | 356/307 |
| 5,493,393 A | * | 2/1996 | Beranek et al. | 356/328 |
| 5,510,273 A | * | 4/1996 | Quinn | 156/160 |
| 5,532,175 A | | 7/1996 | Racanelli et al. | |
| 5,543,340 A | | 8/1996 | Lee | |
| 5,543,947 A | | 8/1996 | Mase et al. | |
| 5,581,092 A | | 12/1996 | Takemura | |
| 5,583,067 A | | 12/1996 | Sanchez | |
| 5,585,295 A | | 12/1996 | Wu | |
| 5,594,569 A | | 1/1997 | Konuma et al. | |
| 5,637,519 A | | 6/1997 | Tsai et al. | |
| 5,686,328 A | | 11/1997 | Zhang et al. | |
| 5,745,046 A | * | 4/1998 | Itsumi et al. | 340/5.83 |
| 5,757,444 A | | 5/1998 | Takemura | |
| 5,767,930 A | | 6/1998 | Kobayashi et al. | |
| 5,841,170 A | | 11/1998 | Adan et al. | |
| 5,851,861 A | | 12/1998 | Suzawa et al. | |
| 5,852,488 A | | 12/1998 | Takemura | |
| 5,856,870 A | * | 1/1999 | Curtiss | 356/328 |
| 5,858,867 A | | 1/1999 | Hsai et al. | |
| 5,880,777 A | * | 3/1999 | Savoye et al. | 348/217.1 |
| 5,903,249 A | | 5/1999 | Koyama et al. | |
| 5,923,961 A | | 7/1999 | Shibuya et al. | |
| 5,963,320 A | * | 10/1999 | Brooks et al. | 356/310 |
| 6,005,661 A | * | 12/1999 | Machler | 356/326 |
| 6,153,445 A | | 11/2000 | Yamazaki et al. | |
| 6,166,397 A | | 12/2000 | Yamazaki et al. | |
| 6,166,414 A | | 12/2000 | Miyazaki et al. | |
| 6,198,133 B1 | | 3/2001 | Yamazaki et al. | |
| 6,211,536 B1 | | 4/2001 | Zhang | |
| 6,256,090 B1 | * | 7/2001 | Chen et al. | 250/227.14 |
| 6,259,138 B1 | | 7/2001 | Ohtani et al. | |
| 6,274,400 B1 | | 8/2001 | Jen | |
| 6,274,887 B1 | | 8/2001 | Yamazaki et al. | |
| 6,277,679 B1 | | 8/2001 | Ohtani | |
| 6,281,552 B1 | | 8/2001 | Kawasaki et al. | |
| 6,284,577 B1 | | 9/2001 | Suzawa et al. | |
| 6,303,963 B1 | | 10/2001 | Ohtani et al. | |
| 6,306,694 B1 | | 10/2001 | Yamazaki et al. | |
| 6,337,731 B1 | | 1/2002 | Takemura | |
| 6,346,730 B1 | | 2/2002 | Kitakado et al. | |
| 6,358,766 B1 | | 3/2002 | Kasahara | |
| 6,362,507 B1 | | 3/2002 | Ogawa et al. | |
| 6,365,917 B1 | | 4/2002 | Yamazaki | |
| 6,384,808 B2 | | 5/2002 | Azami | |
| 6,392,628 B1 | | 5/2002 | Yamazaki et al. | |
| 6,399,988 B1 | | 6/2002 | Yamazaki | |
| 6,407,430 B1 | | 6/2002 | Ohtani et al. | |
| 6,420,200 B1 | | 7/2002 | Yamazaki et al. | |
| 6,469,317 B1 | | 10/2002 | Yamazaki et al. | |

OTHER PUBLICATIONS

Tanaka, et al., "Ultrafast Operation of $V_{th}$–Adjusted $p^+$ –$n^+$ Double–Gate SOI MOSFET'S," IEEE Electron Device Letters, vol. 15 (Oct., 1994), No. 10, pp. 386–388.

Inui et al., "Thresholdless Antiferroelectricity in Liquid Crystals and its Application to Displays," J. Mater Chem., 1996, 6(4), pp. 671–673.

Takada, et al., Proceedings of $46^{TH}$ Spring Meetings of the Society for Applied Physics of Japan, 28P–V–8, p. 1316.

Hwang et al., "Novel Polysilicon/TiN Stacked–Gate Structure for Fully–Depleted SOI/CMOS," IEDM '92, pp. 345–348.

Yoshihara, Ekisho, vol. 3, No. 3, pp. 190–194.

Furue et al., "P–78: Characteristics and Driving Scheme of Polymer–Stabilized Monostable FLCD Exhibiting Fast Response Time and High Contrast Ratio with Gray–Scale Capability," SID '98 DIGEST, pp. 782–785.

Hatano et al, "A Novel Self–Aligned Gate–Overlapped LDD Poly–Si TFT with High Reliability and Performance," IEDM '97, pp. 523–526.

* cited by examiner

OPTICAL DEVICE

FIELD OF THE INVENTION

The invention concerns an optical device, for example, a spectrometer or an optical demultiplexer, where an incident beam is imaged in a curved focal surface.

BACKGROUND OF THE INVENTION

The focal surfaces typically found in optical systems such as optical spectrometers, optical multiplexers, optical demultiplexers, etc. usually have a curved shape of some type. For simplicity, the focal surface may also be referred to as a focal plane or a focal curve. The focal surface may be a simple surface, for example, a sphere, or may have a complex shape with intricate dimensions. In refraction based systems which may utilize a lens, the focal curve may be referred to as what is known in the art as Petzval field curvature. In grating based systems, the focal curve may take the shape of the commonly known "Rowland Circle." *The Design of Optical Spectrometers*, by J. F. James and R. S. Sternberg, (Chapman and Hill, 1969) describes a Rowland Circle as follows:

"If a plane is taken through the center of the grating, perpendicular to the rulings, a circle can be drawn, touching the grating at its center and with a diameter equal to the radius of curvature of the grating. This circle is called Rowland circle. The focusing property of the grating is such that a source of light placed at a point on the Rowland circle is diffracted and refocused to form an image of the source at some other point on the Rowland circle."

As an example, FIG. 1 shows a plot of variations of diffracted focal distance as a function of wavelength for a system employing a diffraction grating. FIG. 1 shows variations for several values of the coefficient Cf, related to the spectral dispersion as a function of wavelength. The curve for Cf=0 shows a relatively simple focal curve with the focal distance, or the diffracted image distance, decreasing as the diffracted wavelength increases. The curve for Cf=0.22 shows a complex curve, where the focal distance varies both positively and negatively as the diffracted wavelength increases.

FIG. 2 shows a plot of several spectral focus planes for a concave grating for various values of the coefficient Cf.

When detecting optical radiation having a focal surface, detection devices are ideally placed directly on the focal surface to minimize losses. These losses may include optical energy losses and/or resolution losses due to unfocused optical radiation impinging on the detector devices. Semiconductor components are frequently used as optical detector elements. These semiconductor components may typically include a quasi-linear or flat detection surface, e.g. a photodiode line or a CCD sensor.

However, placing a detection device on the focal plane of an optical system may present some difficulties. For example, when the detection devices are arranged in a quasi linear fashion, such as a photodiode line, or when the devices are arranged in a two dimensional, flat planar fashion, such as a CCD array, the detection devices cannot reside on a curved focal surface. For example, as mentioned above, the focal surface may be described by a Rowland circle. However, an attempt to place a linear or planar array of detectors on the Rowland circle results in the optical spectrum being in focus at only two wavelength positions, that is, those positions where the Rowland circle intersects the photodiode line or the planar array. At other wavelengths, the optical radiation is not in focus, resulting in at least poor resolution and/or energy transfer. As a further example, currently known optical demultiplexers may receive polychromatic light through various mechanisms, including fiber optics, and that polychromatic light according to its spectrum. The beams of the various wavelengths may be dispersed at various angles with focal points having varying distances from the dispersive element. These focal points may form a focal curve which may be imaged by photosensitive elements. However, if a straight line of elements, such as a commonly available photodiode line, is used to image the focal curve, only the elements that intersect the focal curve will detect the correct amount of optical energy.

When holographic concave gratings are used, the variable groove dimensions allow imaging errors to be minimized to systems stigmatic at three wavelengths. Reference in this regard may be had to "Diffraction Gratings Ruled and Holographic", Handbook, Jobin Yvon S. A.

As a result, for systems using linear, quasi-linear, or planar detection devices, the optical resolution and/or detected energy usually remains attenuated or substantially impaired over a significant part of the spectral range being utilized.

A method is presented in U.S. Pat. No. 4,467,361, entitled "Image Pick-Up Apparatus," by Ohno et al., issued Aug. 21, 1984, where the curved focal surface is coupled to a surface of a photosensor by means of light guides of different lengths. This method has various disadvantages, however, including light loss from unused surfaces between the fiber end surfaces, light loss from reflections off the end surfaces of the fibers, light loss from the finite transmission of the fiber material, photodegradation of the fiber material, and limited resolution of the finite fiber diameters.

EP 768 814 discloses three-dimensional photosensitive structures for optical detectors. These three-dimensional structures are created by applying layers and/or etching recesses. One disadvantage is that special and expensive processes are required to manufacture the photosensitive semiconductor structures. Another disadvantage is that the dimensions of the three-dimensional structure must be known at the time of manufacture.

An additional disadvantage of known optical systems is their focal lengths. Advances in technology and optical component quality have resulted in optical systems with decreasing focal lengths over time. Currently available small gratings and miniaturized spectrometers exhibit focal lengths as small as approximately 20 mm. However, even shorter focal lengths may be achieved if optical detection systems could be constructed with a radius of curvature that would allow for a focal length of, for example, on the order of 10 mm. For example, in an optical system based on a Rowland Circle, the focal length l is determined by the relationship l=R*cos A, where R is the radius of curvature of the grating and A is the angle between the grating normal and a straight line from the grating center to the focal point. Therefore if the angle A remains constant, a decrease in the radius of curvature results in a decreased focal length.

Accordingly, it is an object of this invention to provide an optical device that may be adapted to a focal surface of an optical system so as to efficiently couple optical energy from the optical system to the optical device.

It is another object of this invention to provide an optical device that may be adapted to a plurality of different focal surfaces.

It is still another object of this invention to provide an optical device having a flexible, thin structure which may be easily formed to the shape of a plurality of different focal surfaces.

It is a further object of this invention to provide an optical device which may attain a radius of curvature that allows for an optical system with a focal length that is substantially shorter than the current state of the art.

SUMMARY OF THE INVENTION

An optical device is disclosed including an imaging device for imaging an incident beam onto a focal surface, and a support element which includes at least one side having a shape corresponding to the focal surface, where the side is located on the focal surface. The invention also includes a sensor array in close contact with the side of the support element having the shape of the focal surface.

BRIEF DESCRIPTION OF THE DRAWINGS

In the following, exemplary embodiments of the invention will be further explained with reference to the figures, wherein.

DETAILED DESCRIPTION OF THE INVENTION

The present invention is directed toward creating an optical device in which an incident beam is imaged onto a curved focal surface in a way that overcomes the disadvantages of the state-of-the-art.

Figure 1:
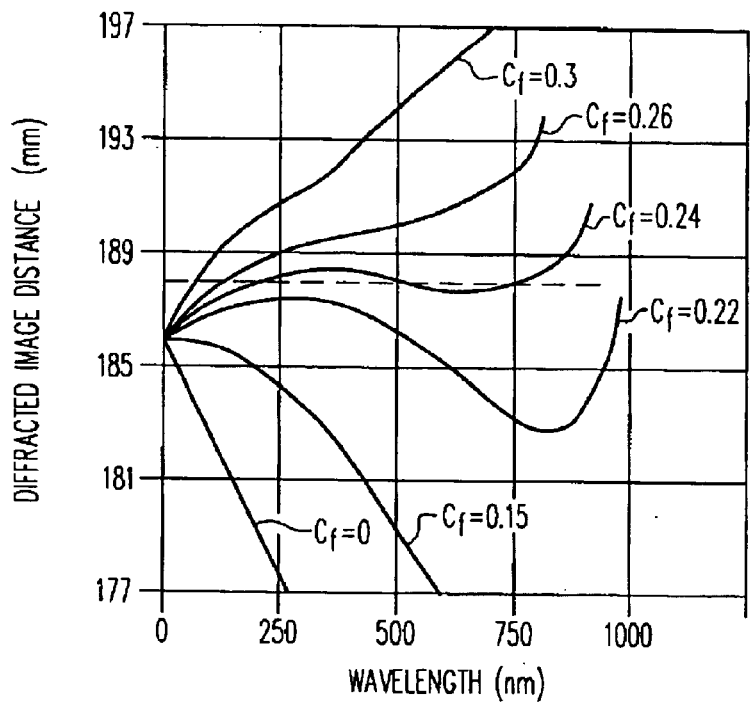
FIG. 1 shows a plot of variations of diffracted focal distance as a function of wavelength.
Figure 2:
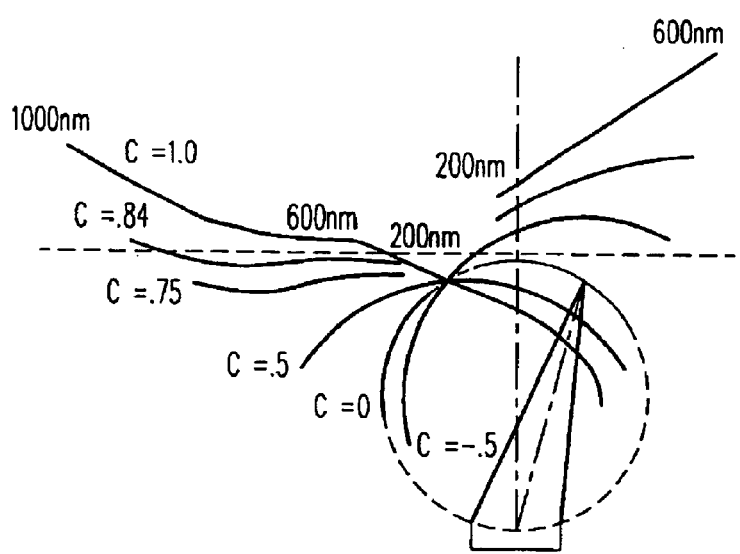
FIG. 2 shows a plot of several spectral focus planes for a concave grating.
Figure 3:
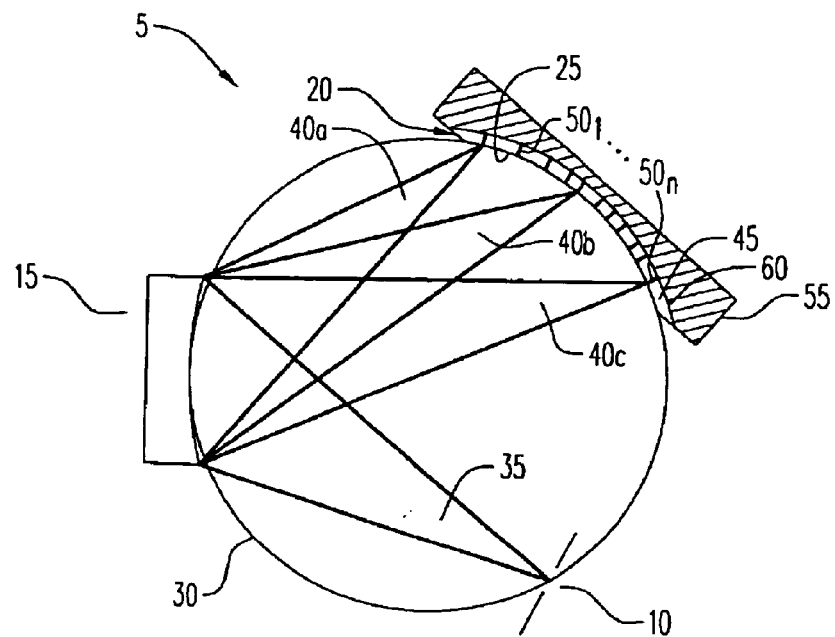
FIG. 3 shows an embodiment according to the teachings of the invention wherein a spectrograph is configured such that the focal surface is circular.

FIG. 3 shows an example of an application of the present invention comprising a spectrograph 5 having a Rowland circle configuration (Paschen-Runge type). The spectrograph may comprise an entrance slit 10, an optical element 15 such as a concave grating, and a sensor array 20. The concave grating 15 has a focal surface 25. The entrance slit 10, the surface of the concave grating 15, the sensor array 20, and the focal surface 25 of the system all preferably lie on a Rowland circle 30. An incident beam 35 may comprise a plurality of wavelengths. Upon passing through the entrance slit 10 and impinging on the concave grating 15, the incident beam 35 is split by the grating 15 into beams of various wavelengths (e.g. 40a, 40b, 40c) that are imaged on the focal surface 25 which has a circular curvature. Thus the optical element 15, in this example a concave grating, serves to image the incident beam onto the focal surface 25. In other words, the focus of each of the individual beams of the various wavelengths taken together define the focal surface 25.

Because the focal surface is, in this example, a circle, the focal surface may be described by the equation, $l = R * \cos A$, where l is the distance from the grating center to the focal surface, R is the radius of curvature of the grating, and A is the angle between the grating normal and the straight line grating center to the focal point.

Corresponding to the present embodiment of the invention, the sensor array 20, preferably includes a flexible structure 45 further comprising a plurality of photosensitive elements $50_1$–$50_n$. The flexible structure 45 is capable of conforming to the focal surface 25. The flexible structure 45 including the photosensitive elements $50_1$–$50_n$ may be supported by a support element 55. One surface 60 of the support element 55 corresponds to the shape of the focal surface 25. The flexible structure 45 including the photosensitive elements $50_1$–$50_n$ is placed in close contact with the surface 60 of support element 55 causing its shape to conform to the shape of the surface 60 and correspondingly to the shape of the focal surface 25. When the surface 60 of the support element 55 is located on the focal surface, the photosensitive elements $50_1$–$50_n$ are also located on the focal surface 25. In the present example, the flexible structure 45 is in the shape of a circular arc. In this embodiment, the photosensitive elements $50_1$–$50_n$ are designed as a photodiode line with, for example, several hundred elements.

Figure 4:
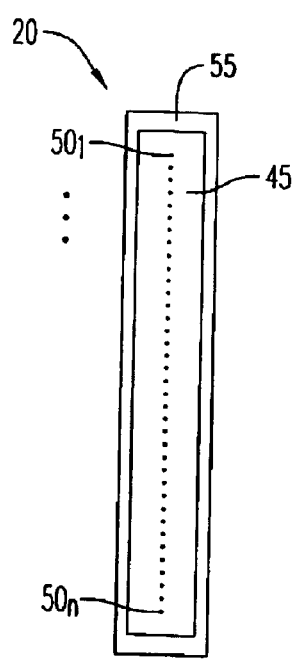
FIG. 4 shows a side view of an optical device utilized in the embodiment of FIG. 3.

FIG. 4 shows a side view of the optical device or sensor array 20. Flexible structure 45 provides a mounting area for the photosensitive elements $50_1$–$50_n$ which are configured as a photodiode line. The flexible structure 45 may be held in contact with the support element 55 utilizing any suitable technique, including adhesive bonding, gluing, or other types of mounting or securing applications. The support element 55 may be fabricated of various materials, including for example, ceramic, glass, plastic, metal, or any other suitable material for construction of the support element 55. The surface 60 of the support element 55 corresponding to the focal surface can be manufactured by any suitable means, including pressing, casting, grinding, injection molding, etc. as suitable for the particular material or materials utilized in fabricating the support element 55.

In a preferred exemplary embodiment, the flexible structure 45 including the photosensitive elements $50_1$–$50_n$ may be manufactured as follows: A conventionally-manufactured semiconductor array, including at least one array of photosensitive elements, for example, photodiode cells, manufactured on a silicon-based wafer by a normal semiconductor manufacturing process is positioned for further processing. By working from the rear, that is, the side opposite the photosensitive elements, the wafer is thinned until the photosensitive elements can be bent without breaking. The wafer thinning process may be mechanical (e.g. grinding), chemical (e.g. etching), or any other suitable process for thinning the wafer. In this manner, the wafer carrying the array of photosensitive elements can be thinned to a thickness of approximately 10 micrometers. A thickness smaller than 10 micrometers may also be achieved with the appropriate processing. In a preferred embodiment, the thickness may range from about 1 micrometer to about 0.1 millimeters.

The desired thickness may depend on the required radius of curvature of the semiconductor. As mentioned above, the focal length of currently available optical systems is dependent on the radius of curvature of the grating and correspondingly on the radius of curvature of the focal surface. Optical systems are currently available with focal lengths of approximately 20 mm. A wafer having a thickness in the micrometer range, depending on the wafer material, could achieve a radius of curvature that may support a focal length of less than 1 cm.

In this example, the thinned wafer is the flexible structure 45. The thinned wafer may then be tested and sawn in the usual manner. The resulting individual flexible structures 45 including the sets of photosensitive elements $50_1$–$50_n$ may each be affixed to a support element 55 that has the shape of the focal surface 25.

Figure 5:
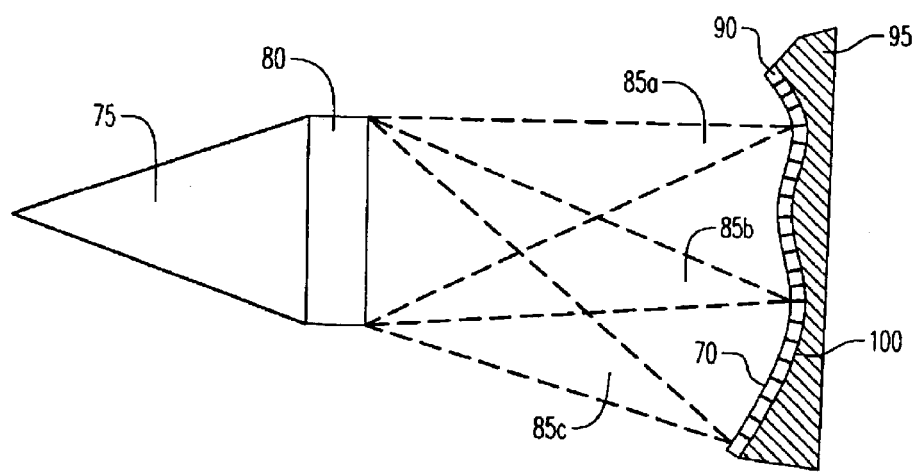
FIG. 5 shows an optical system according to the teachings of the invention having a complex focal surface.

FIG. 5 shows another embodiment having a complex focal surface 70. An incident beam 75 comprising multiple wavelengths passes through optical element 80 and is separated into its component wavelengths, for example, 85a, 85b, and 85c. The component wavelengths are imaged on the focal surface 70. A sensor array 90, including photosensitive elements $50_1$–$50_n$ mounted on the flexible structure 45, similar to optical device 20 (FIG. 3) is positioned in contact with a support element 95. Support element 95 has at least one side 100 with a shape corresponding to the focal surface 70. The sensor array 90 is in close contact with the side 100 of the support element 95 and thus conforms to the shape corresponding to the focal surface 70. The side 100 of the support element 95 is located on the focal surface 70 causing the photosensitive elements $50_1$–$50_n$ to be situated on the focal surface 70.

One advantage of the present invention over the present state of the art is that the shape of a particular focal surface does not have to be known when the sensor array is manufactured. The same sensor array may be adapted to different focal surfaces by shaping a support element to each different focal surface. This also allows a sensor array to be used in a number of different spectrometers. Another advantage of the present invention is that the radius of curvature of the sensor array and thus of the focal surface may be reduced by several orders of magnitude, allowing for focal lengths that are substantially shorter than in the present state-of-the-art.

It should be understood that the focal surfaces 25, 70 are not limited to the shapes shown in the embodiments of FIGS. 3 and 5 but may be any shape suitable or determined by the particular optical system being utilized. For example, in other contemplated embodiments, the focal surfaces 25 (FIG. 3) and 70 (FIG. 5) may be curved in more than one dimension. In the example in FIG. 3, a curvature perpendicular to the plane of the drawing is shown. However, in the case where the focal surface is three dimensional, the flexible structure 45 and the support element 55 may be processed or constructed such that the photosensitive elements $50_1$–$50_n$ may be placed on the three dimensional focal surface.

It should be further understood that the optical elements 15, 80 are not limited to particular types of optical elements but may include any optical element or optical system that includes or exhibits a focal surface.

We claim:

1. An optical device comprising:
   an imaging device for imaging an incident beam onto a focal surface;
   a support element having a surface with a shape corresponding to said focal surface, said surface of said support element being located on said focal surface; and
   a flexible sensor array in close contact with said surface of said support element and having a surface with a shape corresponding to said focal surface.

2. The optical device of claim 1, wherein said flexible sensor array comprises a photosensitive element mounted on a flexible structure.

3. The optical device of claim 2, wherein said flexible structure conforms to said shape of said surface of said support element.

4. The optical device of claim 2, wherein said flexible structure is bonded to said surface of said support element.

5. The optical device of claim 2, wherein said flexible structure has a thickness in a range from 1 micrometer to 0.1 millimeters.

6. The optical device of claim 1, wherein said sensor array comprises a photodiode line.

7. The optical device of claim 1, wherein said imaging device comprises a grating.

8. The optical device of claim 1, wherein said focal surface is defined by a Rowland Circle.

9. An optical device comprising:
   an imaging device for imaging an incident beam on a focal surface; and
   a flexible sensor array formed to a shape of said focal surface by fixing at least a portion of said flexible sensor array.

10. The optical device of claim 9, wherein said at least a portion of said flexible sensor array comprises at least two ends of said flexible sensor array.

11. The optical device of claim 9, wherein said at least a portion of said flexible sensor array comprises at least two points located on a surface of said flexible sensor array.

12. The optical device of claim 9, wherein said at least a portion of said flexible sensor array comprises at least two points located on an edge of said flexible sensor array.

13. The optical device of claim 9, wherein said at least a portion of said flexible sensor array comprises at least two points located on different edges of said flexible sensor array.

14. The optical device of claim 9, further comprising a support element wherein said at least a portion of said flexible sensor array is fixed to said support element and said support element forms said flexible sensor array to said shape of said focal surface.

15. The optical device of claim 9, wherein said flexible sensor array comprises a photosensitive element mounted on a flexible structure.

16. The optical device of claim 15, wherein said flexible structure has a thickness in a range from 1 micrometer to 0.1 millimeters.

17. The optical device of claim 9, wherein said flexible sensor array comprises a photodiode line.

18. The optical device of claim 9, wherein said imaging device comprises a grating.

19. The optical device of claim 9, wherein said focal surface is defined by a Rowland Circle.

20. An optical device comprising:
   an imaging device for imaging an incident beam onto a focal surface;
   a support element having a surface conforming to and being located on said focal surface; and
   a flexible sensor array affixed to said surface of said support element and having a surface with a shape corresponding to said focal surface.

21. An optical device comprising:
   an imaging device for imaging an incident beam onto a curved focal surface;
   a support element having a surface conforming to and being located on said curved focal surface; and
   a flexible semiconductor array of photosensitive elements affixed to said surface of said support element and having a surface that conforms to said curved focal surface.

* * * * *